(12) United States Patent
Chang et al.

(10) Patent No.: US 8,468,407 B2
(45) Date of Patent: Jun. 18, 2013

(54) METHOD FOR CREATING TEST CLOCK DOMAIN DURING INTEGRATED CIRCUIT DESIGN, AND ASSOCIATED COMPUTER READABLE MEDIUM

(75) Inventors: Ming-Tung Chang, Hsinchu County (TW); Min-Hsiu Tsai, Hsinchu County (TW); Chih-Mou Tseng, Chiayi County (TW); Jen-Yang Wen, Hualien County (TW); Chien-Mo Li, Taipei (TW)

(73) Assignees: Global Unichip Corp., Hsinchu Science Park, Hsinchu (TW); National Taiwan University, Taipei (TW); Taiwan Semiconductor Manufacturing Co., Ltd., Hsin-Chu Science Park, Hsin-Chu (TW)

( * ) Notice: Subject to any disclaimer, the term of this patent is extended or adjusted under 35 U.S.C. 154(b) by 104 days.

(21) Appl. No.: 13/213,086

(22) Filed: Aug. 19, 2011

(65) Prior Publication Data

US 2012/0233513 A1    Sep. 13, 2012

(30) Foreign Application Priority Data

Mar. 9, 2011  (TW) .............................. 100107883 A

(51) Int. Cl.
*G01R 31/28*  (2006.01)

(52) U.S. Cl.
USPC ............................ 714/731; 714/727; 714/729

(58) Field of Classification Search
USPC .................. 716/103; 714/726, 729, 731, 727, 714/744
See application file for complete search history.

(56) References Cited

U.S. PATENT DOCUMENTS

| | | | | |
|---|---|---|---|---|
| 6,954,887 | B2 * | 10/2005 | Wang et al. ................... | 714/729 |
| 7,127,695 | B2 * | 10/2006 | Huang et al. .................. | 716/103 |
| 7,155,651 | B2 * | 12/2006 | Nadeau-Dostie et al. .... | 714/731 |
| 7,793,179 | B2 * | 9/2010 | Sul ................................ | 714/726 |
| 7,831,877 | B2 * | 11/2010 | Sul et al. ....................... | 714/731 |
| 7,840,861 | B2 * | 11/2010 | Sul ................................ | 714/726 |
| 2010/0169728 | A1 * | 7/2010 | Dehnert et al. ............... | 714/731 |

* cited by examiner

*Primary Examiner* — David Ton
(74) *Attorney, Agent, or Firm* — Winston Hsu; Scott Margo

(57) ABSTRACT

In a method for creating a clock domain in a layout of an integrated circuit, a test circuit of the integrated circuit includes a plurality of first scan cells and a plurality of second scan cells, the first scan cells are arranged to be on a first scan chain, and the second scan cells are arranged to be on a second scan chain. The method includes: for a first region in the layout, determining whether the first region needs a test clock domain adjustment according to densities of first scan cells and second scan cells within the first region; and when it is determined that the first region needs the test clock domain adjustment, arranging at least one first scan cell within the first region to be on the second scan chain.

17 Claims, 7 Drawing Sheets

METHOD FOR CREATING TEST CLOCK DOMAIN DURING INTEGRATED CIRCUIT DESIGN, AND ASSOCIATED COMPUTER READABLE MEDIUM

BACKGROUND OF THE INVENTION

1. Field of the Invention

The present invention relates to a method for creating a test clock domain during an integrated circuit design, and more particularly, to a method for creating a test clock domain which can prevent serious local voltage drop within a region.

2. Description of the Prior Art

Devices for circuit detecting and testing are usually required when designing and producing a digital logic circuit. Circuit testing devices in the art include a plurality of flip flop scan cells stitched together to form a scan chain, where predetermined logic values are sequentially loaded into the scan chain to test the digital logic circuit.

During the scan test, if there are too many flip-flops belonging to a same test clock in a specific region of the digital logic circuit—in other words, the density of the flip-flops belonging to the same test clock is too high—more power is required when the flip-flops within the specific region are triggered by a clock signal. A serious transient supply voltage drop will occur to change the behaviors of the elements within the specific region, and the scan chain will thereby fail to detect the digital logic circuit.

SUMMARY OF THE INVENTION

It is therefore an objective of the present invention to provide a method for creating a test clock domain which can prevent serious local voltage drop within a region, in order to solve the above-mentioned problem.

According to one embodiment of the present invention, a method for adjusting a test clock domain during a layout of an integrated circuit is provided, where: the integrated circuit comprises a plurality of scan cells; the plurality of scan cells comprise at least a plurality of first scan cells and a plurality of second scan cells; the plurality of first scan cells are arranged to be on a first scan chain and are tested by a first test clock; the plurality of second scan cells are arranged to be on a second scan chain and are tested by a second test clock different from the first test clock; the integrated circuit comprises a plurality of regions; and the method comprises: for a first region of the integrated circuit, determining whether the first region requires a test clock domain adjustment or not according to a density of the first scan cells and a density of the second scan cells of the first region. It should be noted that the density of the first scan cells and the density of the second scan cells of the first region should, respectively, be less than a default value, and the density of the first/second scan cells is an area ratio between the area within an area unit occupied by the first/second scan cells and the area unit. The method further comprises: when it is determined that the first region requires the test clock domain adjustment (i.e. the density of the first scan cells of the first region is greater than the default value, and the density of the second scan cells of the first region is less than the default value), rearranging at least one first scan cell of the first region to be on the second scan chain, and the first scan cell is then tested by the second test clock.

According to another embodiment of the present invention, a method for creating a test clock domain during a design for testability (DFT) of an integrated circuit is provided, where the integrated circuit comprises a plurality of scan cells (or scan flip-flops), the plurality of scan cells (or scan flip-flops) comprise at least a plurality of first scan cells (or scan flip-flops) and a plurality of second scan cells (or scan flip-flops), the plurality of first scan cells (or scan flip-flops) are arranged to be on a first scan chain and are tested by a first test clock, the plurality of second scan cells (or scan flip-flops) are arranged to be on a second scan chain and are tested by a second test clock different from the first test clock, an integrated circuit layout comprises a plurality of regions, and the method comprises: for a first region of the integrated circuit, determining arrangements of scan chains and test clocks according to a density of the first scan cells and a density of the second scan cells of the first region; and when the density of the first scan cells of the first region is greater than a default value, and the density of the second scan cells of the first region is less than the default value, arranging at least one first scan cell of the first region to be on the second scan chain, and the first scan cell is then tested by the second test clock.

According to another embodiment of the present invention, a computer readable medium is provided. The computer readable medium stores a test clock domain adjustment code, where the test clock domain adjustment code is utilized for adjusting a test clock domain of an integrated circuit after layout, the integrated circuit comprises a plurality of scan cells, the plurality of scan cells comprise at least a plurality of first scan cells and a plurality of second scan cells, the plurality of first scan cells are arranged to be on a first scan chain and are tested by a first test clock, the plurality of second scan cells are arranged to be on a second scan chain and are tested by a second test clock different from the first test clock, the integrated circuit comprises a plurality of regions, and when the test clock domain adjustment code is executed by a processor, the test clock domain adjustment code executes the following steps: for a first region of the integrated circuit, determining whether the first region requires a test clock domain adjustment or not according to a density of the first scan cells and a density of the second scan cells of the first region; and when it is determined that the first region requires the test clock domain adjustment, the density of the first scan cells of the first region is greater than a default value, and the density of the second scan cells of the first region is less than the default value, rearranging at least one first scan cell of the first region to be on the second scan chain, and the first scan cell is then tested by the second test clock.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
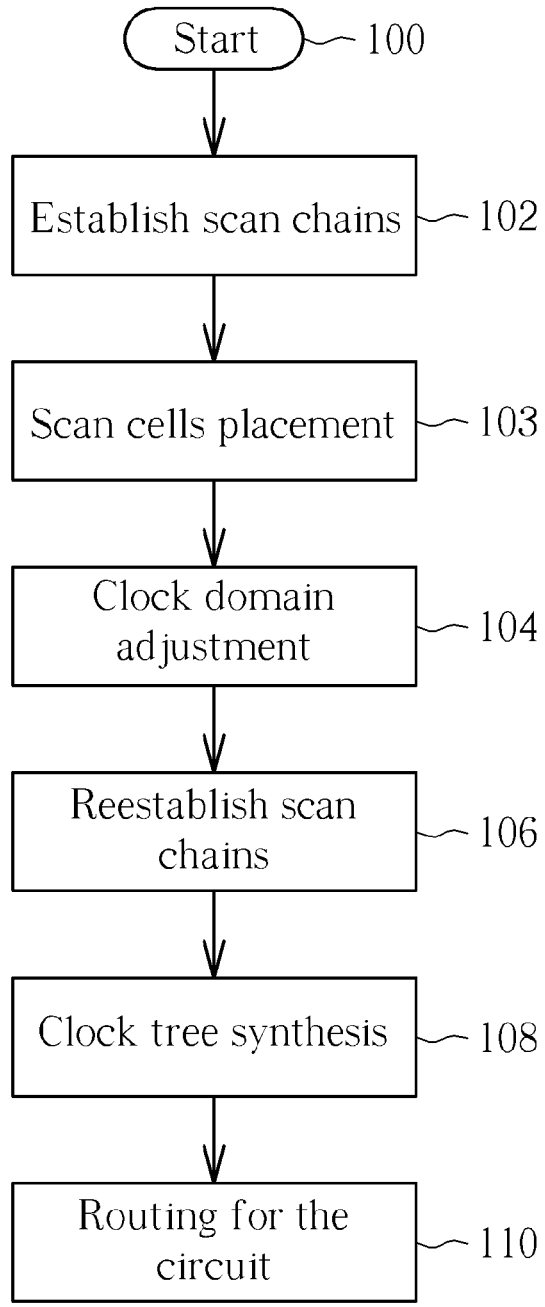
FIG. 1 is a flowchart of a method for creating a test clock domain during an integrated circuit design according to one embodiment of the present invention.

Please refer to FIG. 1. FIG. 1 is a flowchart of a method for creating a test clock domain during an integrated circuit design according to one embodiment of the present invention. Referring to FIG. 1, the flow is described as follows:

In Step 100, the flow starts. In Step 102, a system establishes scan chains and confirms the test clock domains to which the scan chains belong. Then, in Step 103, a plurality of scan cells are arranged (placed) on the scan chains established in Step 102, where the scan chains belong to different test clock domains (i.e., the scan chains are tested by different test clocks). In addition, in this embodiment, the scan cells are implemented by flip-flops. In Step 104, the plurality of scan cells perform a test clock domain adjustment. In Step 106, the scan chains are reestablished. The Steps 104 and 106 are to confirm the test clock domain to which each scan cell belongs; in other words, the scan cell(s) is removed from its original scan chain and rearranged to be on another scan chain, and scan cells belonging to the same scan chain are re-linked to establish a new scan chain. Details of Steps 104 and 106 are described in the flowchart shown in FIG. 2. Then, in Step 108, a clock tree synthesis is performed. Finally, in Step 110, routing for the circuit is performed.

Figure 2:
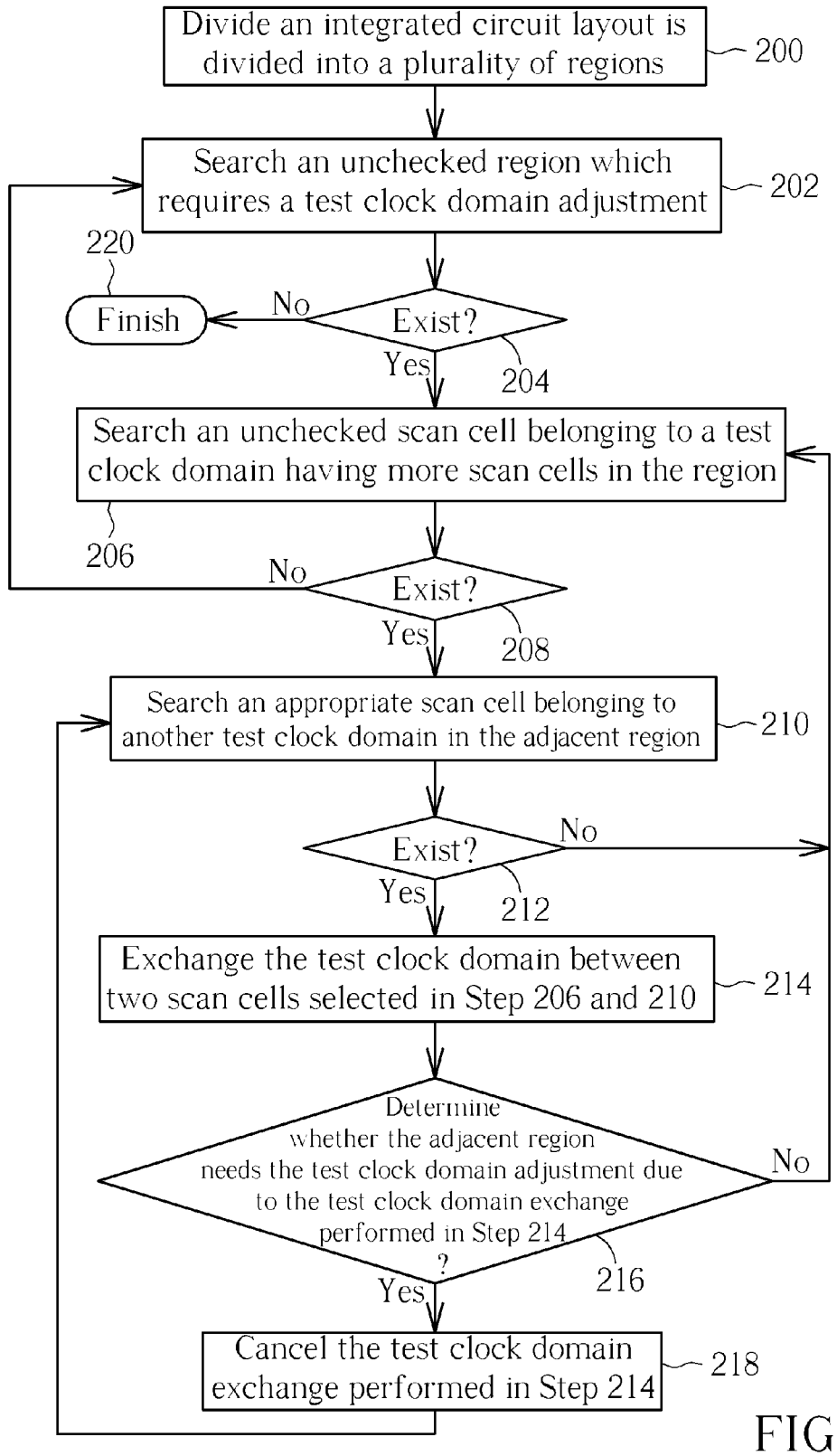
FIG. 2 is a flowchart of a method for adjusting a test clock domain during a layout of an integrated circuit according to a first embodiment of the present invention.
Figure 3:
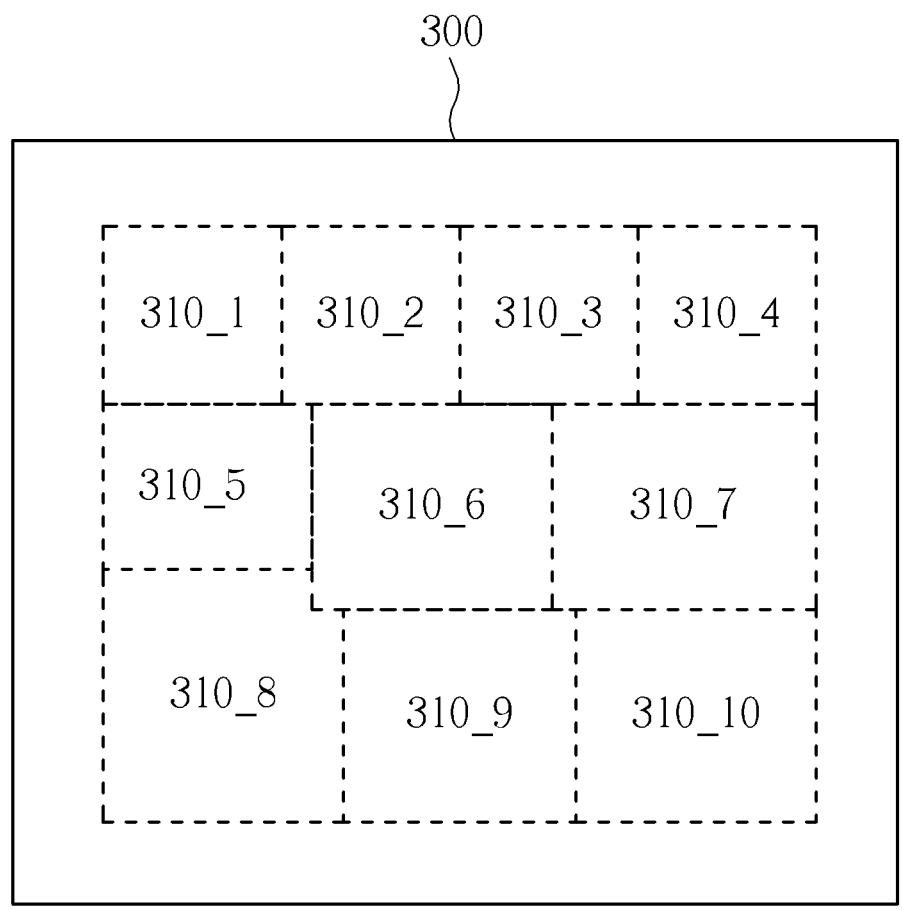
FIG. 3 is a diagram illustrating dividing an integrated circuit layout into a plurality of regions.

Please refer to FIG. 2. FIG. 2 is a flowchart of a method for adjusting a test clock domain during a layout of an integrated circuit according to one embodiment of the present invention. It is noted that, provided the results are substantially the same, the steps are not limited to be executed according to the exact order shown in FIG. 2. Referring to FIG. 2, the flow is described as follows:

In Step 200, referring to FIG. 3, an integrated circuit layout 300 is divided into a plurality of regions 310_1-310_10, where a plurality of scan cells (not shown) are arranged on the integrated circuit layout 300, and the plurality of scan cells are used to form a plurality of scan chains. It is noted that the regions 310_1-310_10 shown in FIG. 3 are for illustrative purposes only, and the shape and number of the regions can be modified by the designer. In addition, in the following embodiment, it is assumed that the plurality of scan cells only include a plurality of first scan cells and a plurality of second scan cells, the plurality of first scan cells are arranged to be on a first scan chain and are tested by a first test clock, and the plurality of second scan cells are arranged to be on a second scan chain and are tested by a second test clock different from the first test clock, where a phase of the first test clock is different from a phase of the second test clock.

In Step 202, the regions 310_1-310_10 are searched for an unchecked region which requires a test clock domain adjustment (i.e., a region where a density of the flip-flops belonging to the same test clock in said region is too high). For example, assuming that the region 310_1 is unchecked, it is determined whether the region 310_1 requires the test clock domain adjustment by determining whether the density of the flip-flops belonging to the same test clock in the region 310_1 is greater than a default value: here, the density is an area ratio between the area within an area unit occupied by the scan cells belonging to the same test clock and the area unit, or the number of scan cells belonging to the same test clock within the area unit. In detail, if the area ratio of the first/second scan cells is greater than the default value, it is determined that the region 310_1 requires the test clock domain adjustment.

In Step 204, if an unchecked region which requires a test clock domain adjustment is searched, the flow enters Step 206. Otherwise, the flow enters Step 220 to finish the flow.

Figure 4:
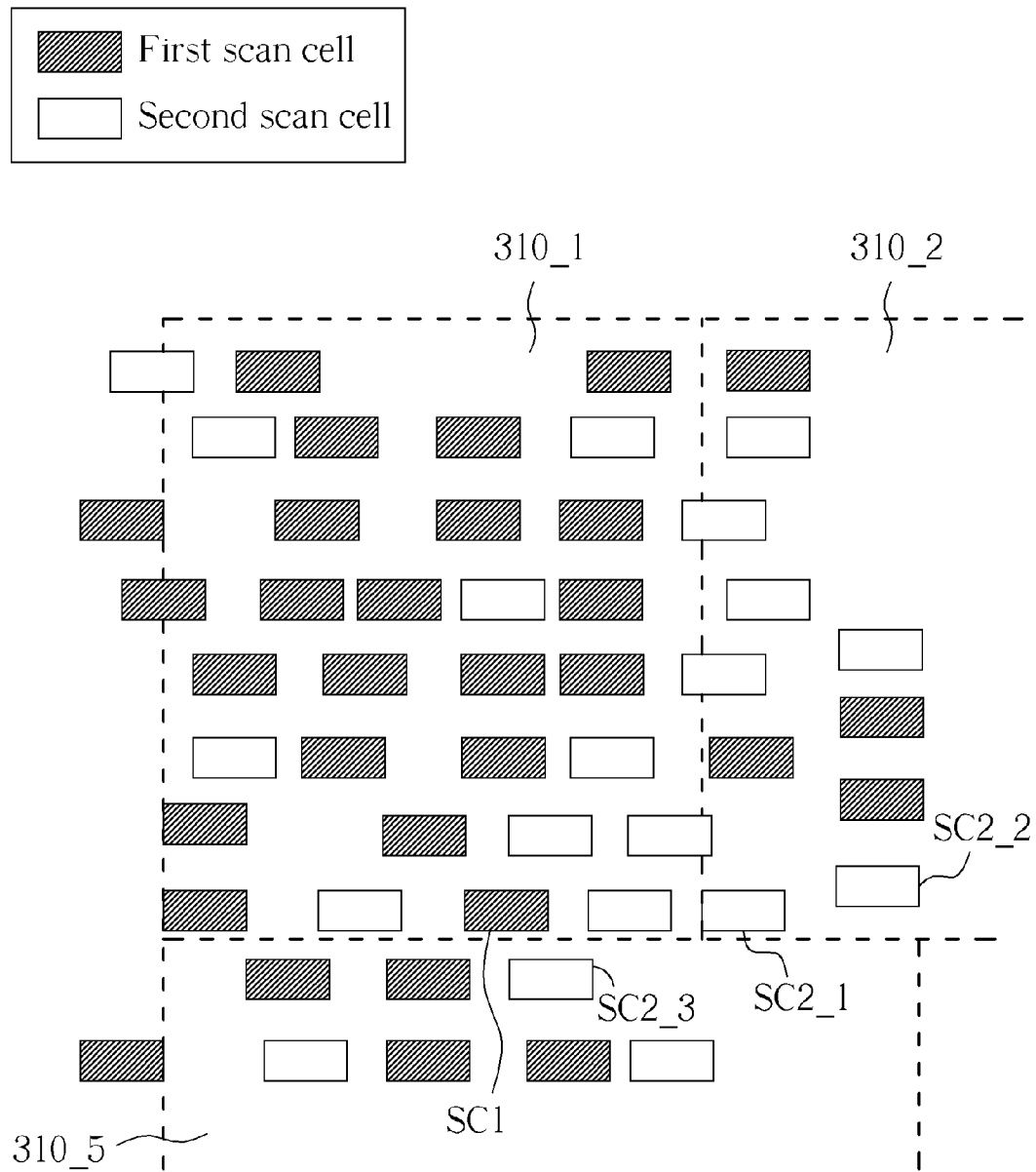
FIG. 4 is a diagram illustrating the scan cells exchanging their test clock domains.

In Step 206, the scan cells in the region 310_1 are searched for an unchecked scan cell belonging to a test clock domain having more scan cells in the region 310_1. Referring to FIG. 4, assuming that the region 310_1 is unchecked and requires the test clock domain adjustment, and the area ratio of the first scan cells in the region 310_1 is greater than the default value, an unchecked first scan cell SC1 is selected in the region 310_1.

In Step 208, if an unchecked scan cell belongs to a test clock domain having first/second scan cells whose area ratio is greater than the default value, the flow enters Step 210. Otherwise, the flow goes back to Step 202 to find a next unchecked region which requires a test clock domain adjustment.

Then, in Step 210, an appropriate scan cell belonging to another test clock domain in the adjacent region is searched. Referring to FIG. 4, by considering the distance to the first scan cell SC1 or considering whether it is suitable to exchange the test clock domain with the first scan cell SC1, a second scan cell SC2_1 is selected from the region 310_2.

In Step 212, if an appropriate second scan cell in the adjacent region is searched, the flow enters Step 214. Otherwise, the flow goes back to Step 206 to search an unchecked scan cell belonging to a test clock domain having more scan cells in the region 310_1.

Then, in Step 214, the test clock domain between two scan cells selected in Step 206 and 210 is exchanged. For example, referring to FIG. 4, assuming that the first scan cell SC1 is selected in Step 206 (originally, the first scan cell SC1 is used to form the first scan chain and is tested by the first test clock), and the second scan cell SC2_1 is selected in Step 210 (originally, the second scan cell SC2_1 is used to form the second scan chain and is tested by the second test clock), then the first scan cell SC1 is rearranged to form the second scan chain and is tested by the second test clock, and the second scan cell SC2_1 is rearranged to form the first scan chain and is tested by the first test clock.

Then, in Step 216, it is determined whether the adjacent region needs the test clock domain adjustment due to the test clock domain exchange performed in Step 214. For example, it is determined if the number of the flip-flips forming the first scan chain in the region 310_2 exceeds the default value (i.e. the region 310_2 requires the test clock domain adjustment) after the second scan cell SC2_1 is rearranged to be on the first scan chain and is tested by the first test clock. If the adjacent region does not need the test clock domain adjustment due to the test clock domain exchange performed in Step 214, the flow goes back to Step 206 to search an unchecked scan cell belonging to a test clock domain having more scan cells in the region 310_1. Otherwise, if the adjacent region needs the test clock domain adjustment due to the test clock domain exchange performed in Step 214, the flow enters Step 218.

In Step 218, the test clock domain exchange performed in Step 214 is cancelled. That is, the first scan cell SC1 returns to the first scan chain and is tested by the first test clock, and the second scan cell SC2_1 returns to the second scan chain and is tested by the second test clock. Then, the flow goes back to Step 210 to search an appropriate second scan cell belonging to another test clock domain in the adjacent region, e.g. the second scan cell SC2_2 in region 310_2 or the second scan cell SC2_3 in the region 310_5.

After processing the above steps, the area ratios of the first/second scan cells respectively belonging to different test clock domains in each region will become closer. That is, in each region, none of the area ratios of the first/second scan cells on a specific scan chain will be greater than the default value. Therefore, the serious transient supply voltage drop of the prior art can be prevented when testing the scan chains, and the faults in digital logic circuit can be detected correctly.

Please note that FIG. 4 is merely used to as an example to describe the details of the flow shown in FIG. 3. In other embodiments of the present invention, the integrated circuit layout can include more than two test clocks.

In addition, in the Steps 210-214, an appropriate second scan cell belonging to another test clock domain in the adjacent region is searched, and the searched first scan cell and the second scan cell exchange their test clock domains. In other embodiments of the present invention, however, this is not necessary, as shown by referring to FIG. 5 (wherein the Steps 500-508 are the same as the Steps 200-208 shown in FIG. 2). Step 510 directly rearranges an unchecked scan cell originally belonging to a test clock domain whose area ratio of the first or second scan cells in the region is greater than the default value to be on another scan chain and is tested by another test clock, and does not need to search an appropriate scan cell belonging to another test clock domain in the adjacent region.

Figure 5:
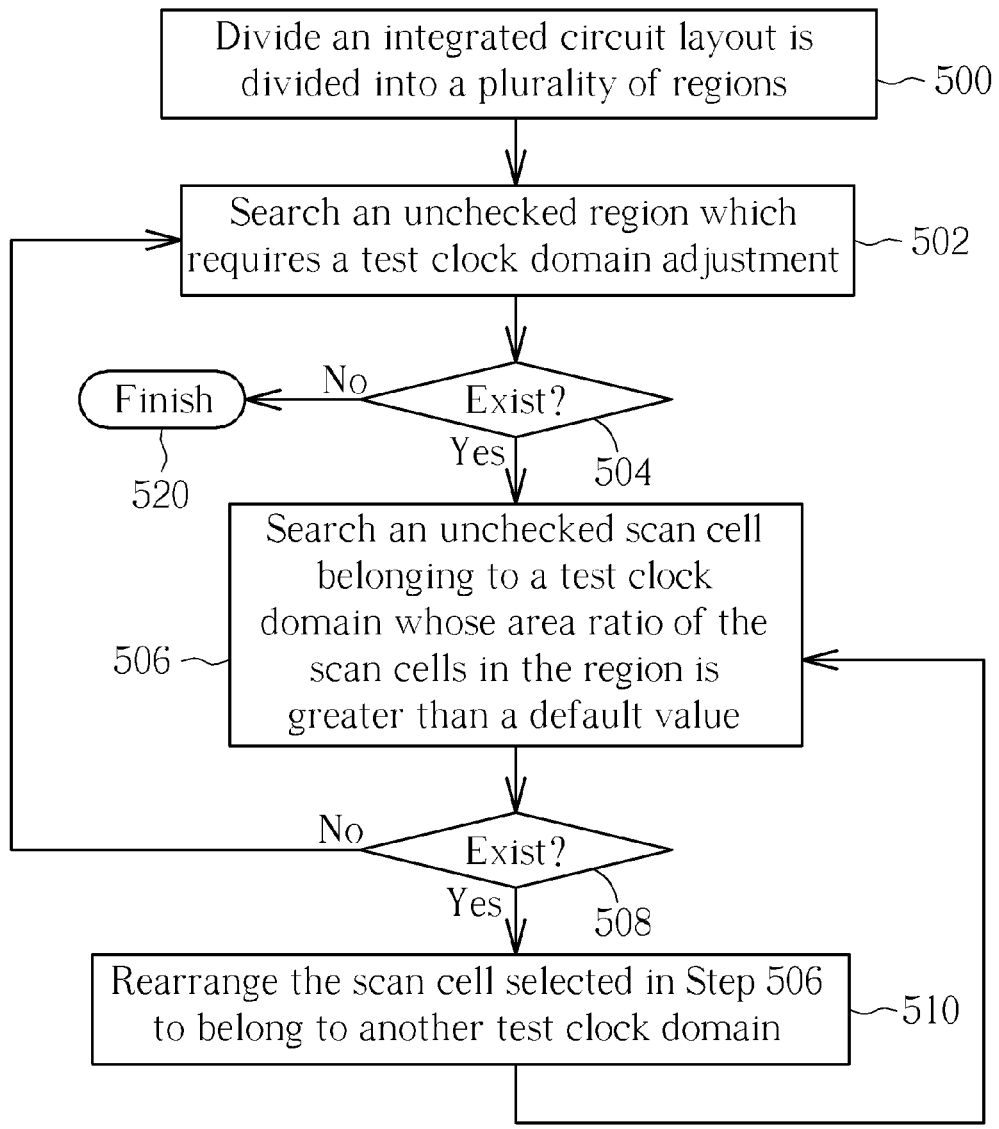
FIG. 5 is a flowchart of a method for adjusting a test clock domain during a layout of an integrated circuit according to a second embodiment of the present invention.
Figure 6:
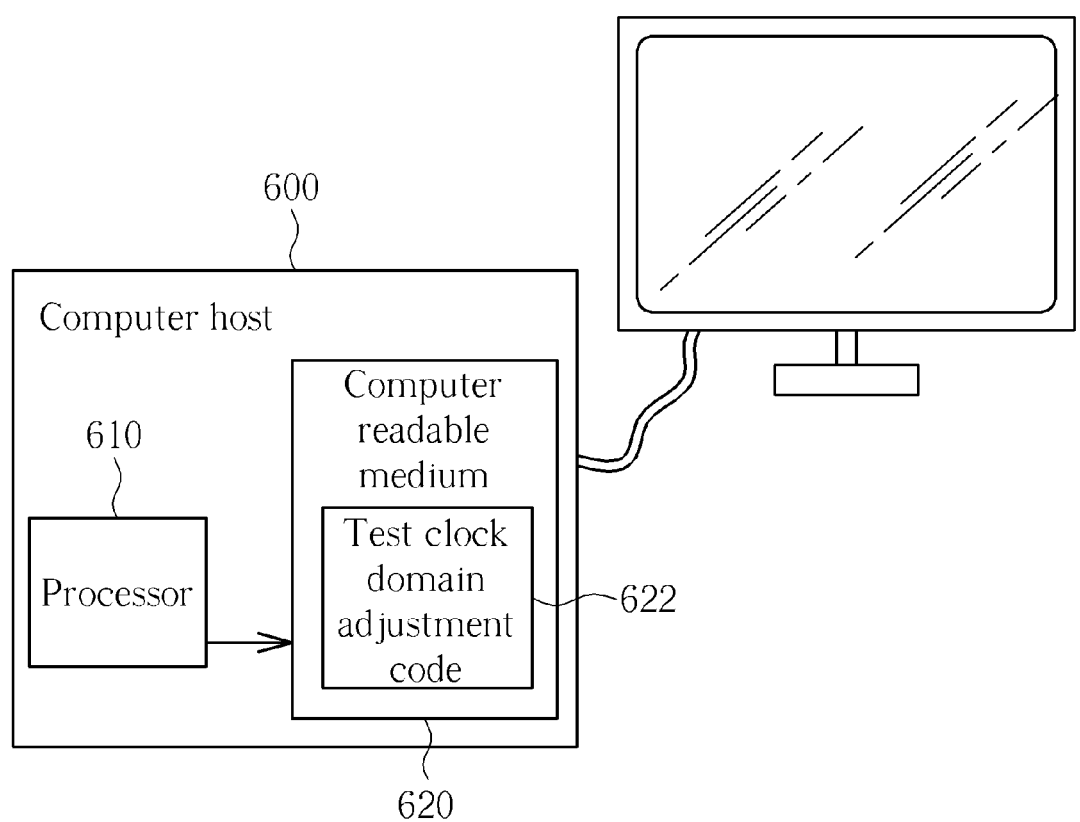
FIG. 6 is a diagram illustrating a computer readable medium according to one embodiment of the present invention.

In addition, the flows shown in FIGS. 1, 2 and 5 can be executed by a computer program stored in a computer readable medium. In detail, referring to FIG. 6, a computer host 600 includes at least a processor 610 and a computer readable medium 620, where the computer readable medium 620 can be a hard disk or other storage devices, and the computer readable medium 620 stores a test clock domain adjustment code 622. When the processor 610 executes the test clock domain adjustment code 622, the computer host 600 will executes the Steps shown in FIGS. 1, 2 and 5.

Figure 7:
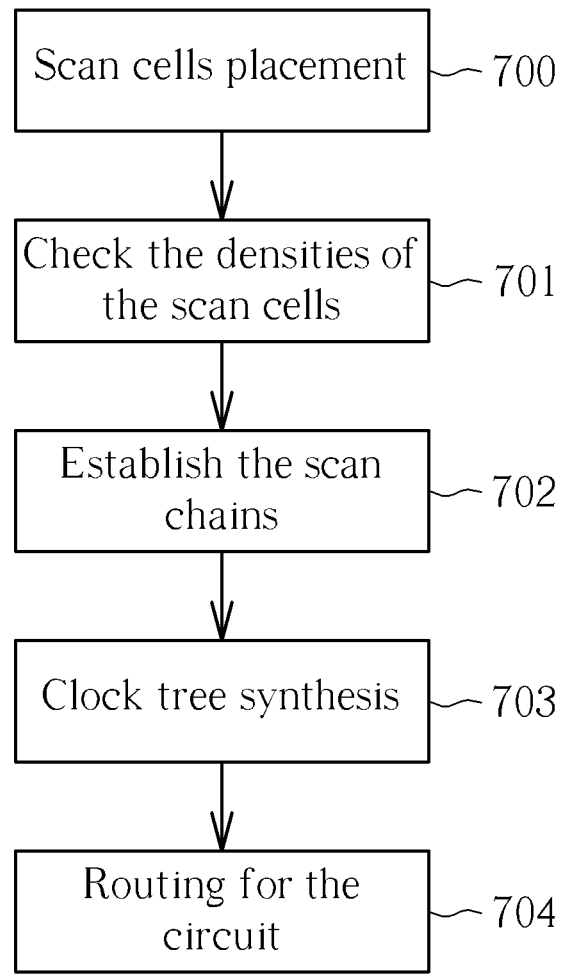
FIG. 7 is a flowchart of a method for creating a test clock domain during an integrated circuit design according to another embodiment of the present invention.

Please refer to FIG. 7. FIG. 7 is a flowchart of a method for creating a test clock domain during an integrated circuit design according to another embodiment of the present invention. Referring to FIG. 7, the flow is described as follows:

Before processing the circuit layout, the Step 700 arranges (places) a plurality of scan cells, where the plurality of scan cells are used to form the plurality of scan chains, respectively, and the scan chains belong to different test clock domains (i.e., the scan chains are tested by different test clocks). In addition, in this embodiment, the plurality of scan cells are implemented by a plurality of flip-flops, respectively. Then, Step 701 checks the densities of the scan cells. In detail, in each region, it is checked whether the density of the scan cells is less than a default value. After confirming that the density of the scan cells in each region is less than the default value, Step 702 establishes the scan chains. Then, in Step 703, a clock tree synthesis is performed. Finally, in Step 704, routing for the circuit is performed.

Briefly summarized, in the method for adjusting a test clock domain during a layout of an integrated circuit of the present invention, the situation of arranging too many flip-flops on a specific scan chain in a region can be prevented. A serious transient supply voltage drop can be prevented when testing the scan chains and the faults in digital logic circuit can be detected correctly.

Those skilled in the art will readily observe that numerous modifications and alterations of the device and method may be made while retaining the teachings of the invention.

What is claimed is:

1. A method for adjusting a test clock domain during a layout of an integrated circuit, wherein the integrated circuit comprises a plurality of scan cells, the plurality of scan cells comprise at least a plurality of first scan cells and a plurality of second scan cells, the plurality of first scan cells are arranged to be on a first scan chain and are tested by a first test clock, the plurality of second scan cells are arranged to be on a second scan chain and are tested by a second test clock different from the first test clock, and the layout of the integrated circuit comprises a plurality of regions, and the method comprises:

for a first region of the integrated circuit, determining whether the first region requires a test clock domain adjustment or not according to a density of first scan cells and a density of second scan cells of the first region; and when it is determined that the first region requires the test clock domain adjustment, the density of first scan cells of the first region is greater than a default value, and the density of second scan cells of the first region is less than the default value, rearranging at least one first scan cell of the first region on the second scan chain, and the first scan cell is then tested by the second test clock.

2. The method of claim 1, wherein the density of first scan cells is an area ratio between the area within an area unit occupied by the first scan cells and the area unit, or a number of first scan cells within the area unit; and the density of second scan cells is an area ratio between the area within the area unit occupied by the second scan cells and the area unit, or a number of second scan cells within the area unit.

3. The method of claim 1, further comprising:

when it is determined that the first region requires the test clock domain adjustment, the density of first scan cells of the first region is greater than the default value, and the density of second scan cells of the first region is less than the default value, rearranging at least one second scan cell of a second region on the first scan chain, and the second scan cell is then tested by the first test clock.

4. The method of claim 3, wherein the second region is adjacent to the first region.

5. The method of claim 3, further comprising:

after rearranging the first scan cell of the first region on the second scan chain, and rearranging the second scan cell of the second region on the first scan chain, determining whether the second region requires the test clock domain adjustment or not according to whether a density of scan cells arranged on the first scan train is greater than the default value; and when it is determined that the second region requires the test clock domain adjustment, recovering the second scan cell of the second region to be on the second scan chain, and the second scan cell is then tested by the second test clock.

6. The method of claim 5, further comprising:

after recovering the second scan cell of the second region to be on the second scan chain, rearranging a second scan cell of a third region on the first scan chain, and the second scan cell of the third region is then tested by the first test clock.

7. The method of claim 6, wherein the third region is adjacent to the first region.

8. A method for creating a test clock domain during a layout of an integrated circuit, wherein the integrated circuit comprises a plurality of scan cells, the plurality of scan cells comprise at least a plurality of first scan cells and a plurality of second scan cells, the plurality of first scan cells are arranged to be on a first scan chain and are tested by a first test clock, the plurality of second scan cells are arranged to be on a second scan chain and are tested by a second test clock different from the first test clock, and the layout of the integrated circuit comprises a plurality of regions, and the method comprises:

for each region of the layout of the integrated circuit, forming the first scan chain and the second scan chain according to a density of first scan cells and a density of second scan cells of each region.

9. The method of claim 8, wherein the density of first scan cells is an area ratio between the area within an area unit occupied by the first scan cells and the area unit, or a number of first scan cells within the area unit; and the density of second scan cells is an area ratio between the area within the area unit occupied by the second scan cells and the area unit, or a number of second scan cells within the area unit.

10. The method of claim 8, further comprising:

forming the first scan chain and the second scan chain by making the density of first scan cells and the density of second scan cells of each region be less than a default value.

11. A non-transitional tangible computer readable medium storing a test clock domain adjustment code, wherein the test clock domain adjustment code is utilized for adjusting test clock domains of a layout of an integrated circuit, the integrated circuit comprises a plurality of scan cells, the plurality of scan cells comprise at least a plurality of first scan cells and a plurality of second scan cells, the plurality of first scan cells are arranged to be on a first scan chain and are tested by a first test clock, the plurality of second scan cells are arranged to be on a second scan chain and are tested by a second test clock different from the first test clock, and the layout of the integrated circuit comprises a plurality of regions, and when the test clock domain adjustment code is executed by a processor, the test clock domain adjustment code executes the following steps:

for a first region of the integrated circuit, determining whether the first region requires a test clock domain adjustment or not according to a number of first scan cells and a number of the second scan cells of the first region; and when it is determined that the first region requires the test clock domain adjustment, and the number of first scan cells is greater than the number of second scan cells of the first region, rearranging at least one first scan cell of the first region on the second scan chain, and the first scan cell is then tested by the second test clock.

12. The non-transitional tangible computer readable medium of claim 11, wherein the step of determining whether the first region requires the test clock domain adjustment or not according to the number of first scan cells and the number of the second scan cells of the first region comprises:

determining whether the first region requires the test clock domain adjustment by determining whether the number of first scan cells and the number of second scan cells is greater than a default value.

13. The non-transitional tangible computer readable medium of claim 11, wherein when the test clock domain adjustment code is executed by the processor, the test clock domain adjustment code further executes the following steps:

when it is determined that the first region requires the test clock domain adjustment, and the number of first scan cells is greater than the number of second scan cells of the first region, rearranging at least one second scan cell of a second region on the first scan chain, and the second scan cell is then tested by the first test clock.

14. The non-transitional tangible computer readable medium of claim 13, wherein the second region is adjacent to the first region.

15. The non-transitional tangible computer readable medium of claim 13, wherein after rearranging the first scan cell of the first region on the second scan chain, and rearranging the second scan cell of the second region on the first scan chain, the test clock domain adjustment code further executes the following steps:

determining whether the second region requires the test clock domain adjustment or not according to whether a number of scan cells arranged on the first scan train is greater than the default value; and when it is determined that the second region requires the test clock domain adjustment, recovering the second scan cell of the second region to be on the second scan chain, and the second scan cell is then tested by the second test clock.

16. The non-transitional tangible computer readable medium of claim 15, wherein after recovering the second scan cell of the second region to be on the second scan chain, the test clock domain adjustment code further executes the following steps:

rearranging a second scan cell of a third region on the first scan chain, and the second scan cell of the third region is then tested by the first test clock.

17. The non-transitional tangible computer readable medium of claim 16, wherein the third region is adjacent to the first region.

* * * * *